US008247842B2

(12) United States Patent
Sato (10) Patent No.: US 8,247,842 B2
(45) Date of Patent: Aug. 21, 2012

(54) NITRIDE SEMICONDUCTOR DEVICE HAVING GRADED ALUMINUM CONTENT

(75) Inventor: Ken Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 215 days.

(21) Appl. No.: 12/696,470

(22) Filed: Jan. 29, 2010

(65) Prior Publication Data

US 2010/0244096 A1    Sep. 30, 2010

(30) Foreign Application Priority Data

Mar. 26, 2009   (JP) .................................. 2009-076235

(51) Int. Cl.
*H01L 21/02*    (2006.01)
(52) U.S. Cl. ................................. 257/190; 257/E29.091
(58) Field of Classification Search ........................ None
See application file for complete search history.

(56) References Cited

U.S. PATENT DOCUMENTS

2005/0110043 A1*  5/2005  Otsuka et al. ................. 257/194

FOREIGN PATENT DOCUMENTS

| JP | 5-206588 | 8/1993 |
|---|---|---|
| JP | 2003-22970 | 1/2003 |
| JP | 2004-524250 | 8/2004 |
| JP | 2005-158889 | 6/2005 |
| JP | 2006-210692 | 8/2006 |
| JP | 2007-180499 | 7/2007 |

OTHER PUBLICATIONS

U.S. Appl. No. 12/620,008, filed Nov. 17, 2009, Sato.

* cited by examiner

*Primary Examiner* — Evan Pert
*Assistant Examiner* — Fei Fei Yeung Lopez
(74) *Attorney, Agent, or Firm* — Oblon, Spivak, McClelland, Maier & Neustadt, L.L.P.

(57) ABSTRACT

A device includes a substrate; a buffer layer; and a device formation layer, wherein the buffer layer is formed by sequentially stacking, a plurality of times, a first nitride-based semiconductor layer made of a material having a lattice constant lower than a lattice constant of a material of the substrate; a first composition graded layer made of a material having a lattice constant gradually higher than the lattice constant of the first nitride-based semiconductor layer in a thickness direction; a second nitride-based semiconductor layer made of a material having a lattice constant higher than the lattice constant of the first nitride-based semiconductor layer; and a second composition graded layer made of a material having a lattice constant gradually lower than the lattice constant of the second nitride-based semiconductor layer in the thickness direction, and the second composition graded layer is thicker than the first composition graded layer.

6 Claims, 5 Drawing Sheets

NITRIDE SEMICONDUCTOR DEVICE HAVING GRADED ALUMINUM CONTENT

CROSS REFERENCE TO RELATED APPLICATIONS AND INCORPORATION BY REFERENCE

This application is based upon and claims the benefit of priority from prior Japanese Patent Application P2009-076235 filed on Mar. 26, 2009; the entire contents of which are incorporated by reference herein.

TECHNICAL FIELD

The present invention relates to a semiconductor device constituted by a substrate and a device formation layer made of different materials.

BACKGROUND ART

When a device formation layer made of a different semiconductor material from that of a substrate is to be formed on the substrate, damage such as cracks disadvantageously occurs due to a difference in lattice constant between the substrate and the device formation layer.

Considering this problem, Patent Literature 1 discloses a technique for suppressing damage such as cracks. According to this conventional technique, a buffer layer is provided between a substrate and a device formation layer. The buffer layer includes a first layer made of AlN, a fourth layer made of AlMGaN, a second layer made of GaN, and a third layer made of AlGGaN, which layers are repeatedly stacked in this order. Symbol M indicates an element selected from between In (indium) and B (boron).

According to the technique of the Patent Literature 1, Al content rates of the third and fourth layers are set lower than that of the first layer. The Al content rates of the third and fourth layers are gradually changed in a thickness direction. Due to these factors, this conventional technique can relax the stress due to the difference in the lattice constant between the substrate and the device formation layer and can improve crystallinity to some extent.

CITATION LIST

Patent Literature

Patent Literature 1:
Japanese Patent Laid-Open Publication No. 2005-158889

SUMMARY OF INVENTION

Technical Problem

However, the technique of the Patent Literature 1 has a problem such that the fourth layer composition-graded to the first layer made of AlN that causes a tensile stress has a composition gradient equal in ratio to the third layer. Therefore, damage such as cracks cannot be suppressed sufficiently. This problem becomes conspicuous when the semiconductor device is made thicker.

Solution to Problem

The present invention has been achieved to solve the above conventional problems, an object of the present invention is to provide a semiconductor device capable of suppressing damage.

First aspect of a semiconductor device of the present invention includes a substrate; a buffer layer formed on the substrate; and a device formation layer formed on the buffer layer, and containing a nitride-based semiconductor, wherein the buffer layer is formed by sequentially stacking, a plurality of times, a first nitride-based semiconductor layer made of a material having a lattice constant lower than a lattice constant of a material of the substrate; a first composition graded layer formed on the first nitride-based semiconductor layer, and made of a material having a lattice constant gradually higher than the lattice constant of the first nitride-based semiconductor layer in a thickness direction; a second nitride-based semiconductor layer formed on the first composition graded layer, and made of a material having a lattice constant higher than the lattice constant of the first nitride-based semiconductor layer; and a second composition graded layer formed on the second nitride-based semiconductor layer, and made of a material having a lattice constant gradually lower than the lattice constant of the second nitride-based semiconductor layer in the thickness direction, and the second composition graded layer is thicker than the first composition graded layer.

Second aspect of a semiconductor device of the present invention includes a substrate made of a material containing silicon; a buffer layer formed on the substrate; and a device formation layer formed on the buffer layer, and containing a nitride-based semiconductor, wherein the buffer layer is formed by sequentially stacking, a plurality of times, a first nitride-based semiconductor layer containing aluminum; a first composition graded layer formed on the first nitride-based semiconductor layer, an aluminum content rate of the first composition graded layer being reduced gradually; a second nitride-based semiconductor layer formed on the first composition graded layer, an aluminum content rate of the second nitride-based semiconductor layer being none or lower than an aluminum content rate of the first nitride-based semiconductor layer; and a second composition graded layer formed on the second nitride-based semiconductor layer, an aluminum content rate of the second composition graded layer being increased gradually, and the second composition graded layer is thicker than the first composition graded layer.

According to third aspect of the device of the present invention, a change amount of each of the aluminum content rate of the first composition graded layer and the aluminum content rate of the second composition graded layer is constant in a thickness direction.

According to fourth aspect of the device of the present invention, thicknesses of the first composition graded layer and the second composition graded layer closer to the substrate are smaller than thicknesses of the first composition graded layer and the second composition graded layer closer to the device formation layer.

According to fifth aspect of the device of the present invention, a change amount of the aluminum content rate of the first composition graded layer with respect to a thickness of the first composition graded layer near each of an interface between the first composition graded layer and the first nitride-based semiconductor layer and an interface between the first composition graded layer and the second nitride-based semiconductor layer is smaller than a change amount of the aluminum content rate of the first composition graded layer with respect to a thickness of a central portion of the first composition graded layer.

According to sixth aspect of the device of the present invention, a change amount of the aluminum content rate of the second composition graded layer with respect to a thickness of the second composition graded layer near each of an interface between the second composition graded layer and the first nitride-based semiconductor layer and an interface between the second composition graded layer and the second nitride-based semiconductor layer is smaller than a change amount of the aluminum content rate of the second composition graded layer with respect to a thickness of a central portion of the second composition graded layer.

Advantageous Effects of Invention

According to the present invention, the second composition graded layer composition-graded to the first nitride-based semiconductor layer that causes a tensile stress is made thick, thereby reducing a change amount of a lattice constant of the second composition graded layer. As a result, a stress relaxing effect of the second composition graded layer can be improved and damage such as cracks can be, therefore, suppressed.

Furthermore, according to the present invention, the second composition graded layer composition-graded to the first nitride-based semiconductor layer that causes tensile the stress is made thick, thereby reducing a change amount of the Al content rate of the second composition graded layer. As a result, the stress relaxing effect of the second composition graded layer can be improved and damage such as cracks can be, therefore, suppressed.

DESCRIPTION OF EMBODIMENTS

First Embodiment

Figure 1:
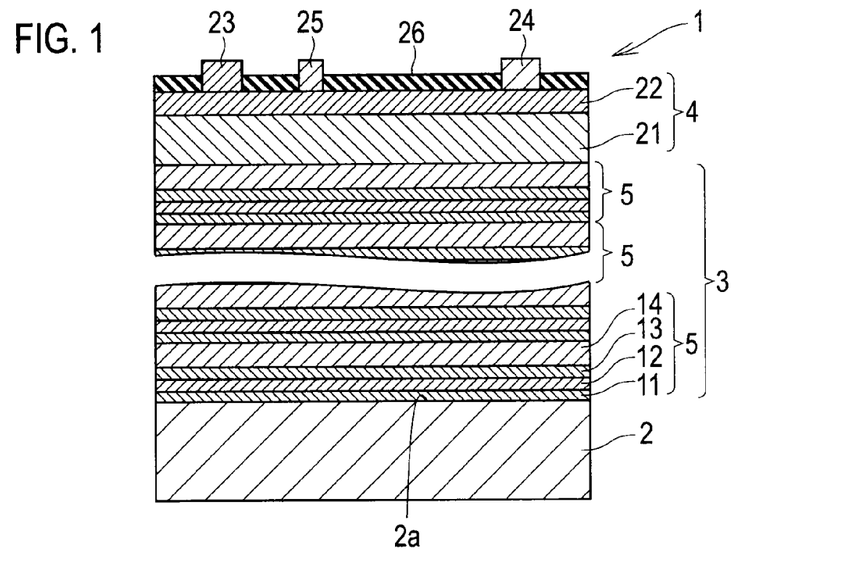
FIG. 1 is a cross-sectional view of a semiconductor device according to a first embodiment.
Figure 2:
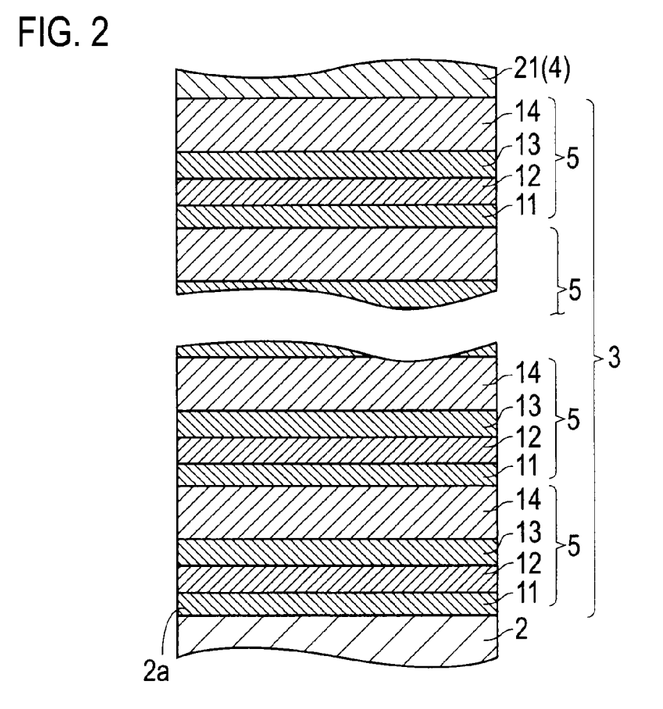
FIG. 2 is a cross-sectional view of a buffer layer.
Figure 3:
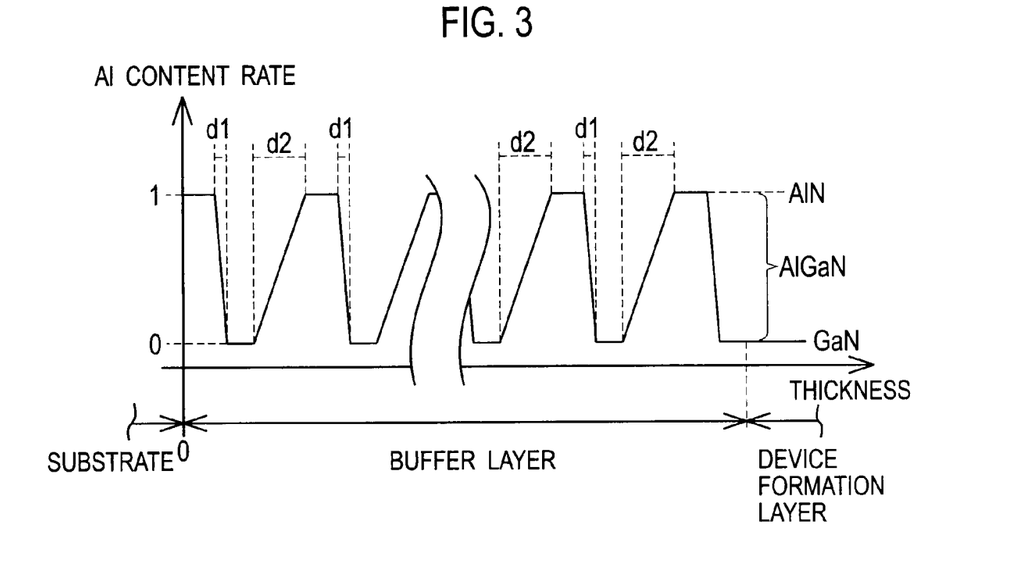
FIG. 3 is a graph showing a relationship between thicknesses of constituent layers of the buffer layer and Al content rates of the constituent layers.

A first embodiment in which a semiconductor device according to the present invention is applied to an HEMT (high electron mobility transistor) is described with reference to the drawings. FIG. 1 is a cross-sectional view of the semiconductor device according to the first embodiment. FIG. 2 is a cross-sectional view of a buffer layer. FIG. 3 is a graph showing a relationship between thicknesses of constituent layers of the buffer layer and Al content rates of the constituent layers.

As shown in FIG. 1, a semiconductor device 1 according to the first embodiment includes a substrate 2, a buffer layer 3, and a device formation layer 4.

The substrate 2 supports the buffer layer 3 and the device formation layer 4. The substrate 2 is made of n-type monocrystalline silicon containing n-type impurities of a group V element such as P (phosphorus).

The buffer layer 3 functions to relax a stress resulting from a difference in lattice constant between silicon constituting the substrate 2 and nitride-based semiconductor constituting the device formation layer 4. As shown in FIG. 2, the buffer layer 3 is formed on the substrate 2. The buffer layer 3 includes a plurality of multilayer regions 5 stacked periodically. While the number of the multilayer regions 5 is not specifically limited and the number of the multilayer regions 5 is preferably two to 200, more preferably 20 to 80. Each of the multilayer regions 5 includes a first nitride-based semiconductor layer 11, a first composition graded layer 12, a second nitride-based semiconductor layer 13, and a second composition graded layer 14 stacked in this order from a substrate 2-side.

The first nitride-based semiconductor layer 11 is made of AlN (aluminum nitride). Note that a lattice constant of AlN is lower than that of GaN constituting the second nitride-based semiconductor layer 13 to be described later and that of Si constituting the substrate 2. On the other hand, a thermal expansion coefficient of AlN is higher than those of the substrate 2 and the second nitride-based semiconductor layer 13. The first nitride-based semiconductor layer 11 is formed on the substrate 2 or the second composition graded layer 14. The first nitride-based semiconductor layer 11 has a thickness of about 0.5 nm to about 50 nm.

The first composition graded layer 12 functions to improve a stress relaxing effect of the buffer layer 3. The first composition graded layer 12 also functions to suppress a rapid change of stress on an interface between the first nitride-based semiconductor layer 11 and the second nitride-based semiconductor layer 13. The first composition graded layer 12 is formed on the first nitride-based semiconductor layer 11.

The first composition graded layer 12 is made of $Al_xGa_{1-x}N$ ($0 \leq X \leq 1$: gallium nitride aluminum). As shown in FIG. 3, each first composition graded layer 12 is configured so that an Al content rate X gradually decreases, for example, by a certain change amount in a thickness direction from the first nitrogen-based semiconductor layer 11 to the second nitrogen-based semiconductor layer 13 between the first nitrogen-based semiconductor layer 11 and the second nitrogen-based semiconductor layer 13. By so configuring, in a thickness direction, the first composition graded layer 12 is configured so as to make the lattice constant gradually higher than that of the first nitrogen-based semiconductor layer 11.

The first composition graded layer 12 is formed to have a thickness d1 smaller than thicknesses of the first nitrogen-based semiconductor layer 11 and the second nitrogen-based semiconductor layer 13, that is, about 0.5 nm to about 5 nm, preferably about 0.5 nm to about 2 nm.

When the thickness d1 of the first composition graded layer 12 is smaller than 0.5 nm, the flatness of the device formation layer 4 formed on the buffer layer 3 deteriorates. When the thickness d1 of the first composition graded layer 12 exceeds 5 nm, there is a higher probability that cracks occur within the first composition graded layer 12 due to tensile strain resulting from a difference in the lattice constant between the first composition graded layer 12 and the first and second nitride-based semiconductor layers 11 and 13 and a difference in the thermal expansion coefficient between the substrate 2 and the first composition graded layer 12.

The second nitride-based semiconductor layer 13 is made of GaN (gallium nitride). A lattice constant of GaN is higher than that of AlN constituting the first nitride-based semiconductor layer 11 and lower than that of Si constituting the substrate 2. On the other hand, a thermal expansion coefficient of GaN is lower than that of AlN constituting the first nitride-based semiconductor layer 11 and higher than that of Si constituting the substrate 2. The second nitride-based semiconductor layer 13 is formed on the first composition graded layer 12. The second nitride-based semiconductor layer 13 has a thickness of about 0.5 nm to about 500 nm. When the thickness of the second nitride-based semiconductor layer 13 is smaller than 0.5 nm, flatness of the second composition graded layer 14 formed on the second nitride-based semiconductor layer 13 and that of the device formation layer 4 formed on the buffer layer 3 deteriorate. When the thickness of the second nitride-based semiconductor layer 13 exceeds 500 nm, there is a higher probability that the stress relaxing effect deteriorates and cracks occur. In addition, it is also preferable that the second nitride-based semiconductor layer 13 is thicker than the first nitride-based semiconductor layer 11. This can suppress cracks from occurring within the first nitride-based semiconductor layer 11 due to the tensile strain resulting from the difference in the lattice constant between the second nitride-based semiconductor layer 13 and the first and second composition graded layers 12 and 14 and the difference in the thermal expansion coefficient between the substrate 2 and the second nitride-based semiconductor layer 13.

The second composition graded layer 14 functions to improve the stress suppression effect of the buffer layer 3. The second composition graded layer 14 also functions to suppress the rapid change of stress on the interface between the first nitride-based semiconductor layer 11 and the second nitride-based semiconductor layer 13. The second composition graded layer 14 is formed on the second nitride-based semiconductor layer 13.

The second composition graded layer 14 is made of $Al_YGa_{1-Y}N$ ($0 \leq Y \leq 1$: gallium nitride aluminum). As shown in FIG. 3, each second composition graded layer 14 is configured so that an Al content rate Y gradually increases, for example, by a desired change amount (for example, a constant change amount) in the thickness direction from the second nitrogen-based semiconductor layer 13 to the first nitrogen-based semiconductor layer 11. By so configuring, in a thickness direction, the second composition graded layer 14 is configured so as to make the lattice constant gradually lower than that of the second nitrogen-based semiconductor layer 13.

The second composition graded layer 14 is formed to have a thickness d2 larger than thicknesses d1 of the first composition graded layer 12 and smaller than those of the first and second nitrogen-based semiconductor layers 11 and 13, that is, about 0.5 nm to about 5 nm.

When the thickness d2 of the second composition graded layer 14 is smaller than 0.5 nm, the flatness of the device formation layer 4 formed on the buffer layer 3 deteriorates. When the thickness d2 of the second composition graded layer 14 exceeds 5 nm, there is a higher probability that cracks occur within the second composition graded layer 14 due to tensile strain resulting from the difference in the lattice constant between the second composition graded layer 14 and the first and second nitride-based semiconductor layers 11 and 13 and the difference in the thermal expansion coefficient between the substrate 2 and the second composition graded layer 14.

The device formation layer 4 is a layer that functions as a device. The device formation layer 4 is formed on the buffer layer 3. The device formation layer 4 includes an electron translation layer 21, an electron supply layer 22, a source electrode 23, a drain electrode 24, a gate electrode 25, and an insulating layer 26.

The electron translation layer 21 is a layer that translates electrons supplied from the electron supply layer 22 and includes a two-dimensional electron gas layer near an interface between the electron translation layer 21 and the electron supply layer 22. The electron translation layer 21 is made of GaN undoped with impurities. The electron translation layer 21 is formed on the buffer layer 3. The electron translation layer 21 has a thickness of about 500 nm.

The electron supply layer 22 functions to supply electrons to the electron translation layer 21. The electron supply layer 22 is made of $Al_{0.2}Ga_{0.8}N$ doped with Si that is n-type impurities. The electron supply layer 22 is formed on the electron translation layer 21. The electron supply layer 22 has a thickness of about 30 nm.

An AlN layer can be formed between the electron translation layer 21 and the electron supply layer 22 so as to increase a concentration of the electrons contained in the two-dimensional electron gas layer.

Each of the source electrode 23 and the drain electrode 24 is structured to stack Ti (titanium) layer and Al (aluminum) layer. The source electrode 23 and the drain layer 24 are ohmic-connected to the electron supply layer 22. A contact layer having a high concentration of n-type impurities can be provided between the source electrode 23 and drain electrode 24 and the electron supply layer 22.

The gate electrode 25 functions to control current flowing between the source electrode 23 and the drain electrode 24. The gate electrode 25 is structured to stack Ni (nickel) layer and Au (gold) layer. The gate electrode 25 is Schottky-connected to the electron supply layer 22.

A method for manufacturing the semiconductor device 1 according to the first embodiment is described next.

First, the growth principal surface 2a of the substrate 2 made of silicon is pretreated by hydrofluoric acid (HF)-based etchant. Next, the substrate 2 is introduced into a reaction chamber (not shown) of an MOCVD (Metal Organic Chemical Vapor Deposition) device (not shown). The substrate 2 is then subjected to thermal annealing at a temperature of about 1100° C. for about ten minutes, thereby removing an oxide film on a surface of the substrate 2.

TMA (trimethylaluminum) gas and $NH_3$ (ammonium) gas are then supplied into the reaction chamber to epitaxially grow an AlN layer having a thickness of about 5 nm on the growth principal surface 2a of the substrate 2.

The TMA (trimethylammonium) gas, TMG (trimethylgallium) gas, and the $NH_3$ gas are then supplied into the reaction chamber to epitaxially grow an $Al_XGa_{1-X}N$ layer having a thickness of about 0.5 nm to about 2 nm on the first nitride-based semiconductor layer 11, thereby forming the first composition graded layer 12. At this time, the $Al_XGa_{1-X}N$ layer is grown while gradually reducing a flow rate of the TMA gas so as to gradually reduce the Al content rate X of the first composition graded layer 12 in the thickness direction. Alternatively, the Al content rate X of the first composition graded layer 12 can be gradually reduced in the thickness direction by controlling residence of the gas based on a growth temperature or growth pressure.

The TMG gas and the NH$_3$ gas are then supplied into the reaction chamber to epitaxially grow a GaN layer having a thickness of about 20 nm on an upper surface of the first composition graded layer 12, thereby forming the second nitride-based semiconductor layer 13.

The TMA gas, the TMG gas, and the NH$_3$ gas are then supplied into the reaction chamber to epitaxially grow an Al$_y$Ga$_{1-y}$N layer having a thickness of about 0.5 nm to about 5 nm on the second nitride-based semiconductor layer 13, thereby forming the second composition graded layer 14. At this time, the Al$_y$Ga$_{1-y}$N layer is grown while gradually increasing the flow rate of the TMA gas so as to gradually increase the Al content rate Y of the second composition graded layer 14 in the thickness direction. Alternatively, the Al content rate Y of the second composition graded layer 14 can be gradually increased in the thickness direction by controlling residence of the gas based on a growth temperature or growth pressure. The gas is supplied for longer time than that for which the gas is supplied to form the first composition graded layer 12 so as to make the second composition graded layer 14 thicker than the first composition graded layer 12.

As a result, one of the multilayer regions 5 is completed. Thereafter, the same step is repeated for a desired number of times, thereby completing the buffer layer 3.

The TMG gas and the NH$_3$ gas are then supplied into the reaction chamber, thereby forming the electron translation layer 21 having the thickness of about 500 nm and made of undoped GaN on the buffer layer 3.

The TMA gas, the TMG gas, the NH$_3$ gas, and SiH$_4$ (silane) gas are then supplied into the reaction chamber, thereby forming the electron supply layer 22 having the thickness of about 30 nm and made of Al$_{0.2}$Ga$_{0.8}$N doped with Si on the electron translation layer 21.

Next, the substrate 2 completed with the above steps and having the buffer layer 3, the electron translation layer 21, and the electron supply layer 22 formed thereon is taken out from the MOCVD device. Thereafter, the insulating layer 26 made of SiO$_2$ is formed on the electron supply layer 22 by a plasma CVD (Chemical Vapor Deposition) method.

Next, openings for forming the source electrode 23 and the drain electrode 24 are formed in the insulating layer 26 using a resist film (not shown) formed by photolithography and the hydrofluoric acid-based etchant. Thereafter, a Ti (Titanium) layer and an Al (Aluminum) layer are sequentially stacked by electron beam evaporation. A metal film on the resist film as well as the resist film is removed (by a liftoff method). Annealing is performed at about 650° C. for 10 minutes in a N$_2$ (nitrogen) atmosphere, thereby forming ohmic-connection between the metal film and the electron supply layer 22. As a result, the source electrode 23 and the drain electrode 24 are completed.

Next, an opening for forming the gate electrode 25 is formed in the insulating layer 26 using a resist film (not shown) formed by the photolithography and the hydrofluoric acid-based etchant. Thereafter, a Ni (Nickel) layer and an Au (Gold) layer are sequentially stacked by electron beam evaporation. A metal film on the resist film as well as the resist film is then removed (by a liftoff method). Thereafter, without performing annealing, the gate electrode 25 kept Schottky-connected to the electron supply layer 22 is completed.

Finally, the substrate 2 is sliced into devices by a well-known dicing step, thereby completing the semiconductor device 1 according to the first embodiment.

An operation performed by the semiconductor device 1 according to the first embodiment is described next.

First, a voltage is applied to between the drain electrode 24 and the source electrode 12 so that the drain electrode 24 has a high potential. In this state, when a desired control voltage is applied to the gate electrode 25, electrons flow in a path of the source electrode 23, the electron supply layer 22, the electron translation layer 21, the electron supply layer 22, and the drain electrode 24. That is, current flows in an opposite direction to the path of electrons. In this case, the control voltage applied to the gate electrode 25 controls magnitude of the current.

In the buffer layer 3 on the substrate 2, internal cracks due to the rapid change of stress tend to occur to the second composition graded layer 14 that causes a tensile stress on the second nitride-based semiconductor layer 13 under the second composition graded layer 14, as compared with the first composition graded layer 12 that causes a tensile stress on the first nitride-based semiconductor layer 11 under the first composition graded layer 12. However, as described above, the buffer layer 3 is formed so as to make the thickness d2 of the second composition graded layer 14 larger than the thickness d1 of the first composition graded layer 12.

This can make gentler an Al composition gradient of the second composition graded layer 14 the Al content rate Y of which is composition-graded to the first nitride-based semiconductor layer 11 made of AlN that causes the tensile stress. It is thereby possible to improve the stress relaxing effect of micro parts on hetero-interfaces among the respective layers 11 to 14 included in the buffer layer 3 while keeping a good stress balance between the buffer layer 3 and the device formation layer 4. Accordingly, during crystal growth, it is possible to suppress occurrence of damage such as internal cracks to the buffer layer 3 and the device formation layer 4. As a result, the semiconductor device 1 can be made thick while improving crystallinity and flatness of the device formation layer 4.

Moreover, by forming the first and second composition graded layers 12 and 14, it is possible to reduce the stress generated between the first and second nitride-based semiconductor layers 11 and 13 and the first and second composition graded layers 12 and 14, respectively. This can suppress generation of piezoelectric polarization field in the second nitride-based semiconductor layer 13 and suppress parasitic capacitance of the buffer layer 3. Furthermore, by gradually changing the Al content rates of the first and second composition graded layers 12 and 14, it is possible to suppress rapid changes of the lattice constant and the thermal expansion coefficient in the first and second composition graded layers 12 and 14 with respect to the adjacent layers 11 and 13, respectively. Therefore, it is possible to improve the stress relaxing effect of the micro parts on the hetero-interfaces among the layers 11 to 14 in the buffer layer 3 while keeping a good stress balance between the buffer layer 3 and the device formation layer 4.

Second Embodiment

Figure 4:
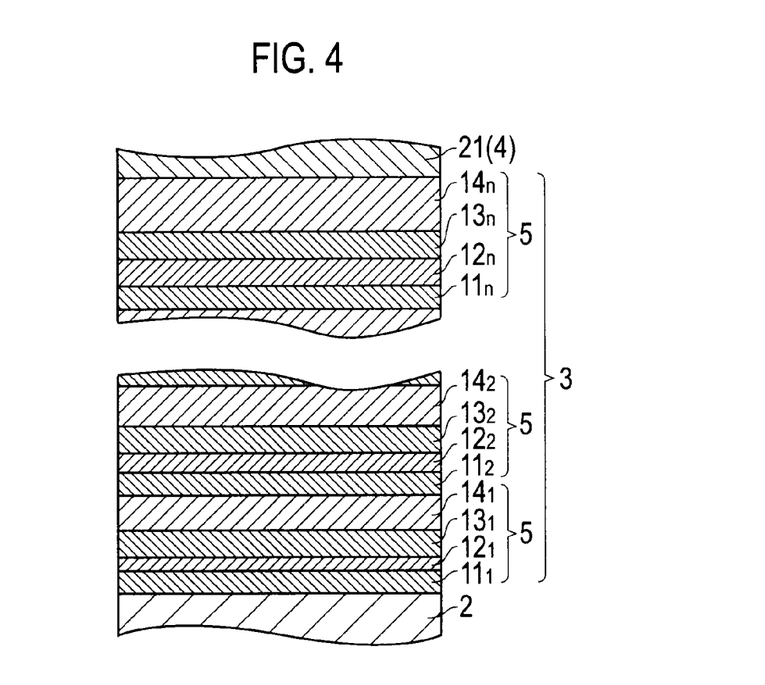
FIG. 4 is a cross-sectional view of a buffer layer according to a second embodiment.
Figure 5:
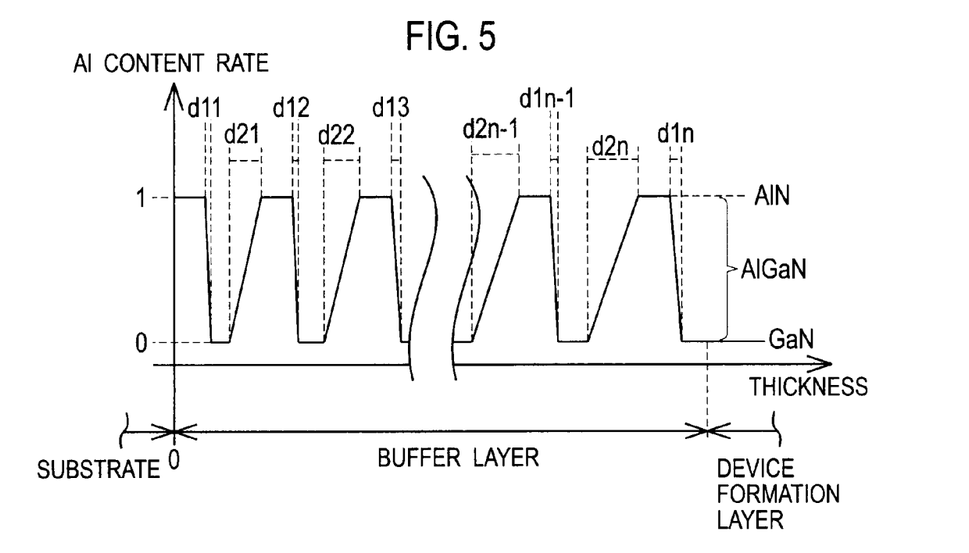
FIG. 5 is a graph showing a relationship between thicknesses of constituent layers of the buffer layer and Al content rates of the constituent layers.

A second embodiment in which a buffer layer differs from the buffer layer according to the first embodiment is described next. FIG. 4 is a cross-sectional view of the buffer layer according to the second embodiment. FIG. 5 is a graph showing a relationship between thicknesses of constituent layers of the buffer layer and Al content rates of the constituent layers. Like constituent elements as those according to the first embodiment are denoted by like reference signs and descriptions thereof will be omitted.

As shown in FIGS. 4 and 5, in the buffer layer 3 according to the second embodiment, thicknesses d1$m$ and d2$m$ of first and second composition graded layers 12$_m$ and 14$_m$ closer to the substrate 2 are smaller than thicknesses d1$m$ and d2$m$ of first and second composition graded layers $12_m$ and $14_m$ closer to the device formation layer 4, respectively. It is assumed that m=1, 2, ... n.

That is, the first and second composition graded layers $12_m$ and $14_m$ are formed so that the thicknesses d1m and d2m satisfy, respectively:

d11<d12< ... <d1n, and
d21<d22< ... <d2n.

By doing so, the thicknesses d1m and d2m of the first and second composition graded layers $12_m$ and $14_m$ are made smaller near the substrate 2 having a high stress, thus increasing periodicity. This can improve a stress relaxing effect of the buffer layer 3 near the substrate 2.

On the other hand, the thicknesses d1m and d2m of the first and second composition graded layers $12_m$ and $14_m$ are made larger near the device formation layer 4. This can improve crystallinity and flatness of the device formation layer 4.

Third Embodiment

Figure 6:
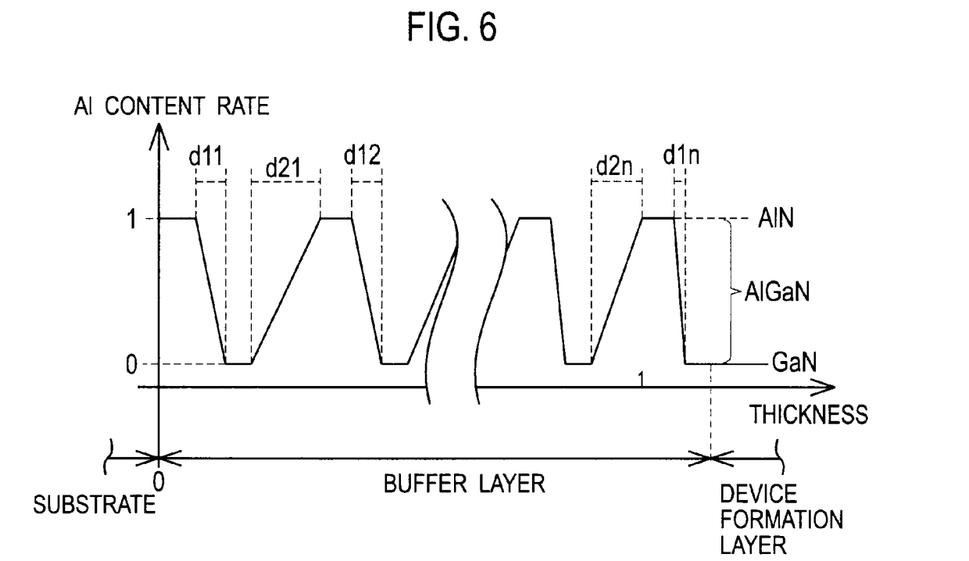
FIG. 6 is a graph showing a relationship between thicknesses of constituent layers of a buffer layer according to a third embodiment and Al content rates of the constituent layers.

A third embodiment in which a buffer layer differs from those according to the above embodiments is described next. FIG. 6 is a graph showing a relationship between thicknesses of constituent layers of the buffer layer according to the third embodiment and Al content rates of the constituent layers. Like constituent elements as those according to the above embodiments are denoted by like reference signs and descriptions thereof will be omitted.

As shown in FIG. 6, in the buffer layer 3 according to the second embodiment, thicknesses d1m and d2m of first and second composition graded layers $12_m$ and $14_m$ closer to the substrate 2 are larger than thicknesses d1m and d2m of first and second composition graded layers $12_m$ and $14_m$ closer to the device formation layer 4, respectively.

That is, the first and second composition graded layers $12_m$ and $14_m$ are formed so that the thicknesses d1m and d2m satisfy, respectively:

d11>d12> ... >d1n, and
d21>d22> ... >d2n.

Fourth Embodiment

Figure 7:
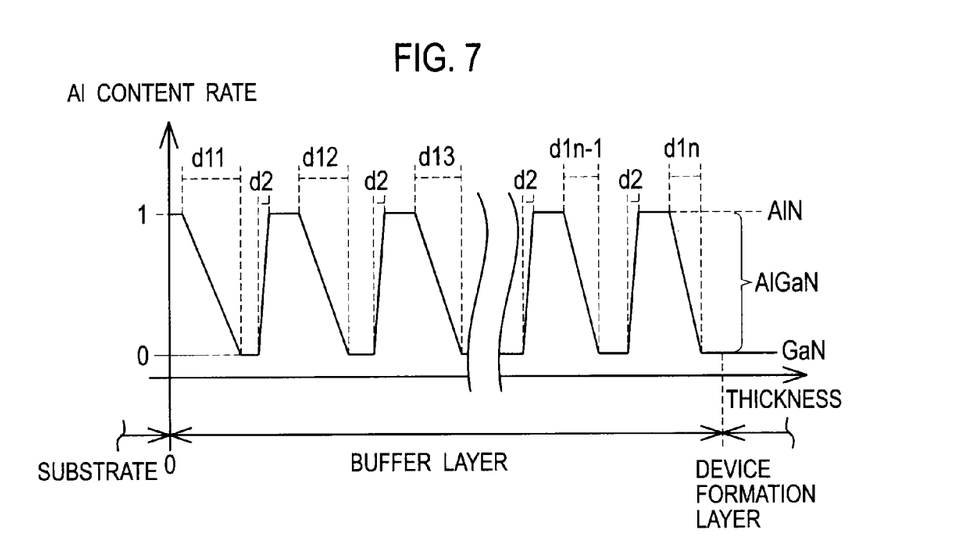
FIG. 7 is a graph showing a relationship between thicknesses of constituent layers of a buffer layer according to a fourth embodiment and Al content rates of the constituent layers.

A fourth embodiment in which a buffer layer differs from those according to the above embodiments is described next. FIG. 7 is a graph showing a relationship between thicknesses of constituent layers of the buffer layer according to the fourth embodiment and Al content rates of the constituent layers. Like constituent elements as those according to the above embodiments are denoted by like reference signs and descriptions thereof will be omitted.

As shown in FIG. 7, in the buffer layer 3 according to the fourth embodiment, the thickness d1m of the first composition graded layer $12_m$ closer to the substrate 2 is larger than the thickness d1m of the first composition graded layer $12_m$ closer to the device formation layer 4.

That is, the first composition graded layer $12_m$ is formed so that the thickness d1m satisfies:

d11>d12> ... >d1n.

On the other hand, the thickness d2 of the second composition graded layer $14_m$ is set constant.

Fifth Embodiment

Figure 8:
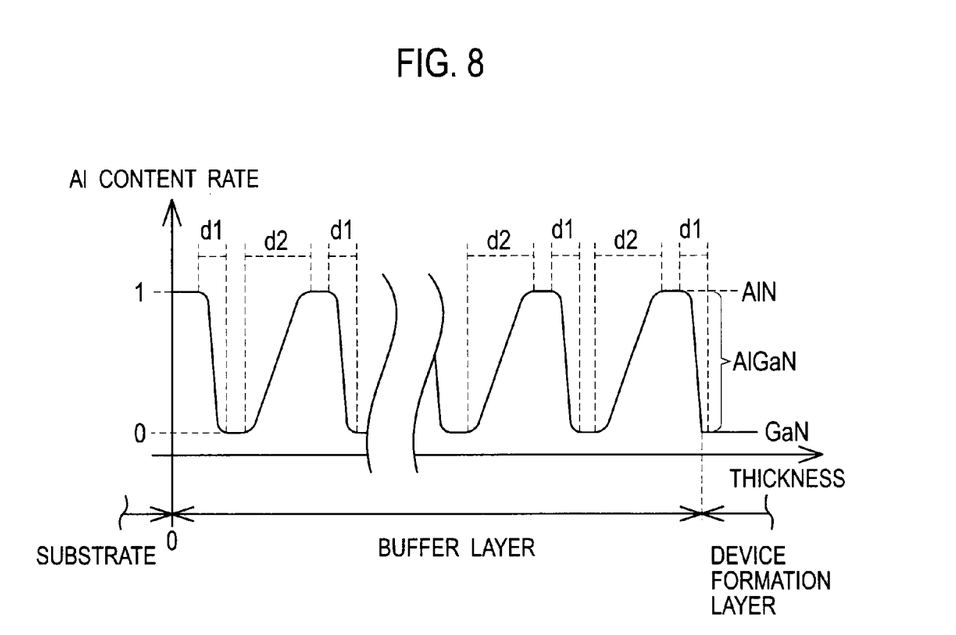
FIG. 8 is a graph showing a relationship between thicknesses of constituent layers of a buffer layer according to a fifth embodiment and Al content rates of the constituent layers.

A fifth embodiment in which a buffer layer differs from those according to the above embodiments is described next. FIG. 8 is a graph showing a relationship between thicknesses of constituent layers of the buffer layer according to the fifth embodiment and Al content rates of the constituent layers. Like constituent elements as those according to the above embodiments are denoted by like reference signs and descriptions thereof will be omitted.

As shown in FIG. 8, in the buffer layer 3 according to the fifth embodiment, change amounts of content rates X and Y with respect to the thicknesses near interfaces between the first and second nitride-based semiconductor layers 11 and 13 and the first and second composition graded layers 12 and 14 are set smaller than those in central portions of the first and second composition graded layers 12 and 14, respectively. This can further improve the stress relaxing effect of the micro parts on the interfaces between the first and second composition graded layers 12 and 14 and the first and second nitride-based semiconductor layers 11 and 13 adjacent to the first and second composition graded layers 12 and 14, respectively, and can keep a good stress balance between the buffer layer 3 and the device formation layer 4.

Sixth Embodiment

Figure 9:
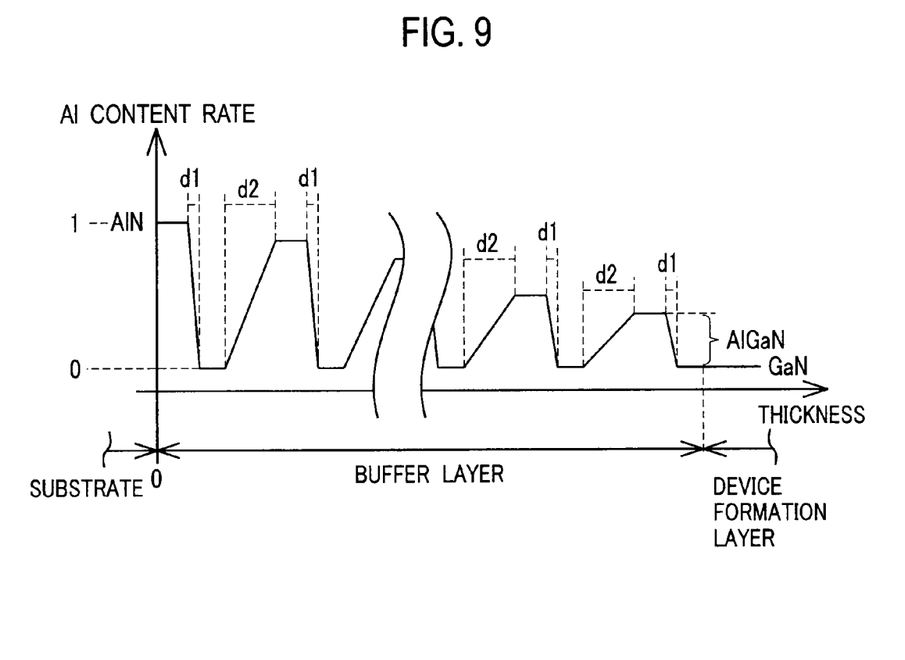
FIG. 9 is a graph showing a relationship between thicknesses of constituent layers of a buffer layer according to a sixth embodiment and Al content rates of the constituent layers.

A sixth embodiment in which a buffer layer differs from those according to the above embodiments is described next. FIG. 9 is a graph showing a relationship between thicknesses of constituent layers of the buffer layer according to the sixth embodiment and Al content rates of the constituent layers. Like constituent elements as those according to the above embodiments are denoted by like reference signs and descriptions thereof will be omitted.

As shown in FIG. 9, in the buffer layer 3 according to the sixth embodiment, the first nitride-based semiconductor layer 11 is made of $Al_{zm}Ga_{1-zm}N$, where m=1, 2, ... , n.

The first nitride-based semiconductor layer 11 is configured so that an Al content rate $Z_m$ satisfies:

$Z_1 > Z_2 > ... > Z_m$.

That is, the first nitride-based semiconductor layer 11 is formed so that a composition thereof is closer to GaN near the device formation layer 4, as compared with a composition thereof near the substrate 2. As a result, crystallinity of the electron translation layer 21 made of GaN can be further improved.

While exemplary embodiments of the present invention have been described above, the invention is not limited to the embodiments described in this specification. The scope of the present invention is defined by the descriptions of the appended claims and by the equivalent range of the claims. A modification mode, which is a partial modification of the above embodiments, is described below.

For example, numerical values, materials, shapes, composition ratios and the like described in the embodiments can be appropriately changed.

Specifically, the first nitride-based semiconductor layer 11 can be made of a material having a lattice constant equal to or lower than those of the substrate 2, the second nitride-based semiconductor layer 13, and the first and second composition graded layers 12 and 14, and represented by a chemical formula $Al_{a1}M_{b1}Ga_{1-a1-b1}N$. In the chemical formula $Al_{a1}M_{b1}Ga_{1-a1-b1}N$, "M" denotes at least one element selected from In (indium) and B (boron). Further, a1 and b1 are numerical values that satisfy:

$0 < a1 \leq 1$,
$0 \leq b1 < 1$, and
$a1+b1 \leq 1$.

That is, the first nitride-based semiconductor layer 11 is made of the material that is a nitride-based compound semiconductor containing Al (aluminum) and selected from among a group consisting of, for example, AlN (aluminum nitride), AlInN (indium nitride aluminum), AlGaN (gallium nitride aluminum), AlInGaN (gallium nitride indium aluminum), AlBN (boron nitride aluminum), AlBGaN (gallium nitride boron aluminum), and AlBInGaN (gallium nitride indium boron aluminum).

The second nitride-based semiconductor layer 13 can be made of a material having a lattice constant lower than that of the substrate 2 and equal to or higher than those of the first nitride-based semiconductor layer 11 and the first and second composition graded layers 12 and 14, and represented by a chemical formula $Al_{a2}M_{b2}Ga_{1-a2-b2}N$. In the chemical formula $Al_{a2}M_{b2}Ga_{1-a2-b2}N$ "M" denotes at least one element selected from In (indium) and B (boron). Furthermore, a2 and b2 are numerical values that satisfy:

$0 \leq a2 < 1$,
$0 \leq b2 < 1$,
$a2+b2 \leq 1$, and
$a2 < a1$.

That is, the second nitride-based semiconductor layer 13 is made of the material selected from among a group consisting of, for example, GaN (gallium nitride), AlInN (indium nitride aluminum), AlGaN (gallium nitride aluminum), AlInGaN (gallium nitride indium aluminum), AlBN (boron nitride aluminum), AlBGaN (gallium nitride boron aluminum), and AlBInGaN (gallium nitride indium boron aluminum). In this case, a2 indicating an Al content rate in the second nitride-based semiconductor layer 13 preferably is a value that satisfies $0 \leq a2 < 0.2$ so as to prevent cracks from possibly occurring due to an increase of Al (aluminum). Furthermore, the Al content rate a2 in the second nitride-based semiconductor layer 13 is lower than the Al content rate a1 in the first nitride-based semiconductor layer 11.

Moreover, each of the first and second composition graded layers 12 and 14 can be made of a material having a lattice constant between those of the first and second nitride-based semiconductor layers 11 and 13 and satisfying a chemical formula $Al_iB_jGa_{1-i-j}N$. In the chemical formula $Al_iB_jGa_{1-i-j}N$, i and j satisfy:

$0 < i < 1$,
$0 \leq j < 1$, and
$i+j \leq 1$.

That is, to the material of each of the first and second composition graded layers 12 and 14, the material selected from among a group consisting of, for example, AlGaN (gallium nitride aluminum), AlInN (indium nitride aluminum), AlInGaN (gallium nitride indium aluminum), AlBN (boron nitride aluminum), AlBGaN (gallium nitride boron aluminum), and AlBInGaN (gallium nitride indium boron aluminum) can be applied.

Further, the substrate 2 is not always made of monocrystalline silicon but can be made of a silicon compound such as polycrystalline silicon or SiC.

Moreover, an initial layer made of the same or different material as or from that of the first nitride-based semiconductor layer 11 can be provided between the substrate 2 and the buffer layer 3 closest to the substrate 2. When the initial layer is made of the same material as that of the first nitride-based semiconductor layer 11, a thickness of the initial layer is preferably 20 nm to 200 nm.

Furthermore, the above embodiments can be appropriately combined.

Further, in the above embodiments, an instance of applying the present invention to an HEMT has been described. Alternatively, the present invention can be applied to an MESFET (Metal-Semiconductor Field Effect Transistor: Schottky gate field effect transistor), an insulated gate field-effect transistor, an optical device including a light-emitting device or the like.

Moreover, in the above embodiments, an MOVPE (Metalorganic vapour phase epitaxy) method has been exemplified in the manufacturing method. Alternatively, other manufacturing methods such as an MBE (Molecular beam epitaxy) method can be applied to the present invention.

INDUSTRIAL APPLICABILITY

The present invention can be used for a semiconductor device constituted by a substrate and a device formation layer made of different materials.

REFERENCE SINGS LIST

1 Semiconductor device
2 Substrate
2a Growth principal surface
3 Buffer layer
4 Device formation layer
5 Multilayer region
11 First nitride-based semiconductor layer
12, $12_m$ First composition graded layer
13 Second nitride-based semiconductor layer
14, $14_m$ Second composition graded layer
21 Electron translation layer
22 Electron supply layer
23 Source electrode
24 Drain electrode
25 Gate electrode
26 Insulating layer

The invention claimed is:

1. A semiconductor device comprising: a substrate; a buffer layer formed on the substrate; and a device formation layer formed on the buffer layer, and containing a nitride-based semiconductor, wherein the buffer layer is formed by sequentially stacking, a plurality of times, a first nitride-based semiconductor layer made of a material having a lattice constant lower than a lattice constant of a material of the substrate; a first composition graded layer formed on the first nitride-based semiconductor layer, and made of a material having a lattice constant gradually higher than the lattice constant of the first nitride-based semiconductor layer in a thickness direction; a second nitride-based semiconductor layer formed on the first composition graded layer, and made of a material having a lattice constant higher than the lattice constant of the first nitride-based semiconductor layer; and a second composition graded layer formed on the second nitride-based semiconductor layer, and made of a material having a lattice constant gradually lower than the lattice constant of the second nitride-based semiconductor layer in the thickness direction, wherein the second composition graded layer is thicker than the first composition graded layer, and a rate of change of aluminum content of the second composition graded layer is smaller than a rate of change of aluminum content of the first composition graded layer.

2. A semiconductor device comprising: a substrate made of a material containing silicon; a buffer layer formed on the substrate; and a device formation layer formed on the buffer layer, and containing a nitride-based semiconductor, wherein the buffer layer is formed by sequentially stacking, a plurality of times, a first nitride-based semiconductor layer containing aluminum; a first composition graded layer formed on the first nitride-based semiconductor layer, an aluminum content rate of the first composition graded layer being reduced gradually; a second nitride-based semiconductor layer formed on the first composition graded layer, an aluminum content rate of the second nitride-based semiconductor layer being none or lower than an aluminum content rate of the first nitride-based semiconductor layer; and a second composition graded layer formed on the second nitride-based semiconductor layer, an aluminum content rate of the second composition graded layer being increased gradually, wherein the second composition graded layer is thicker than the first composition graded layer, and a rate of change of aluminum content of the second composition graded layer is smaller than a rate of change of aluminum content of the first composition graded layer.

3. The semiconductor device according to claim 2, wherein the rate of change of aluminum content of the first composition graded layer and of the second composition graded layer is constant in a thickness direction.

4. The semiconductor device according to claim 2, wherein a thicknesses of the first composition graded layer and the second composition graded layer closer to the substrate are smaller relative to a thicknesses of the first composition graded layer and the second composition graded layer closer to the device formation layer.

5. The semiconductor device according to claim 2, wherein the rate of change of aluminum content of the first composition graded layer with respect to a thickness of the first composition graded layer near each of an interface between the first composition graded layer and the first nitride-based semiconductor layer and an interface between the first composition graded layer and the second nitride-based semiconductor layer is smaller than the rate of change of aluminum content of the first composition graded layer with respect to a thickness of a central portion of the first composition graded layer.

6. The semiconductor device according to claim 2, wherein the rate of change of aluminum content of the second composition graded layer with respect to a thickness of the second composition graded layer near each of an interface between the second composition graded layer and the first nitride-based semiconductor layer and an interface between the second composition graded layer and the second nitride-based semiconductor layer is smaller than the rate of change of aluminum content of the second composition graded layer with respect to a thickness of a central portion of the second composition graded layer.

* * * * *